(12) United States Patent
Cann et al.

(10) Patent No.: US 7,230,335 B2
(45) Date of Patent: Jun. 12, 2007

(54) INSPECTION METHODS AND STRUCTURES FOR VISUALIZING AND/OR DETECTING SPECIFIC CHIP STRUCTURES

(75) Inventors: Jerome L. Cann, Jericho, VT (US); Steven J. Holmes, Guilderland, NY (US); Leendert M. Huisman, South Burlington, VT (US); Cherie R. Kagan, Ossining, NY (US); Leah M. Pastel, Ossining, NY (US); Paul W. Pastel, Essex, VT (US); James R. Salimeno, III, Fairfax, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 10/711,765

(22) Filed: Oct. 4, 2004

(65) Prior Publication Data

US 2006/0071208 A1    Apr. 6, 2006

(51) Int. Cl.
*H01L 23/48* (2006.01)
*H01L 21/302* (2006.01)

(52) U.S. Cl. ............ 257/751; 257/752; 257/774; 438/691; 438/692

(58) Field of Classification Search ........ 438/691, 438/692, 700, 14, 5, 7, 16; 257/751–753, 257/774
See application file for complete search history.

(56) References Cited

U.S. PATENT DOCUMENTS

2003/0084918 A1    5/2003  Kim

2003/0121529 A1    7/2003  Sachdev et al.
2003/0139048 A1    7/2003  Wong et al.
2003/0197859 A1   10/2003  Kubota et al.
2004/0005769 A1*   1/2004  Mikolas .................. 438/612

FOREIGN PATENT DOCUMENTS

JP    2001339102 A    12/2001

OTHER PUBLICATIONS

IBM Technical Disclosure Bulletin, vol. 36, No. 09A, Bachi et al., "Laser Process and Tool for Cleaning or Reworking Epoxy on a Slider", Sep. 1993, pp. 85-86.

* cited by examiner

*Primary Examiner*—Hsien-Ming Lee
(74) *Attorney, Agent, or Firm*—Anthony J. Canale; Hoffman, Warnick & D'Alessandro LLC

(57) ABSTRACT

The present invention provides inspection methods and structures for facilitating the visualization and/or detection of specific chip structures. Optical or fluorescent labeling techniques are used to "stain" a specific chip structure for easier detection of the structure. Also, a temporary/sacrificial illuminating (e.g., fluorescent) film is added to the semiconductor process to facilitate the detection of a specific chip structure. Further, a specific chip structure is doped with a fluorescent material during the semiconductor process. A method of the present invention comprises: providing a first and a second material; processing the first material to form a portion of a semiconductor structure; and detecting a condition of the second material to determine whether processing of the first material is complete.

3 Claims, 10 Drawing Sheets

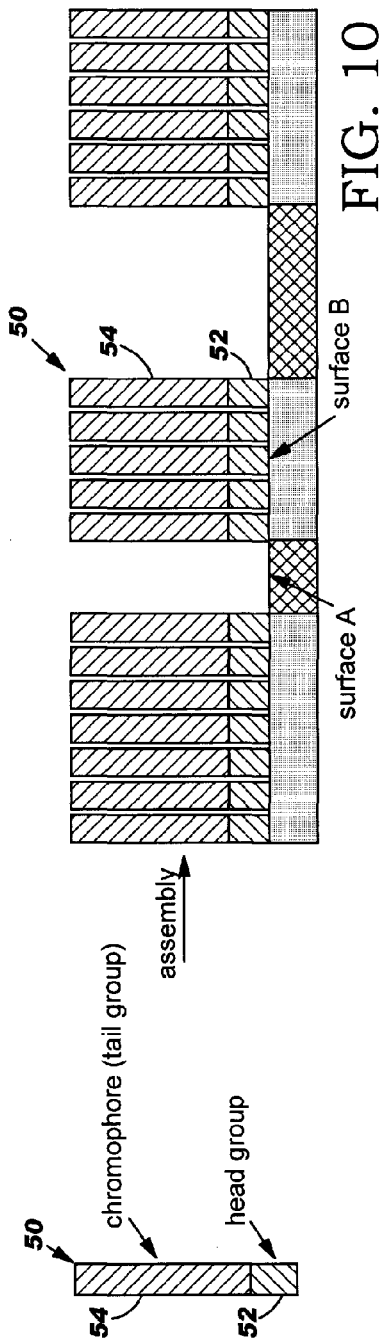
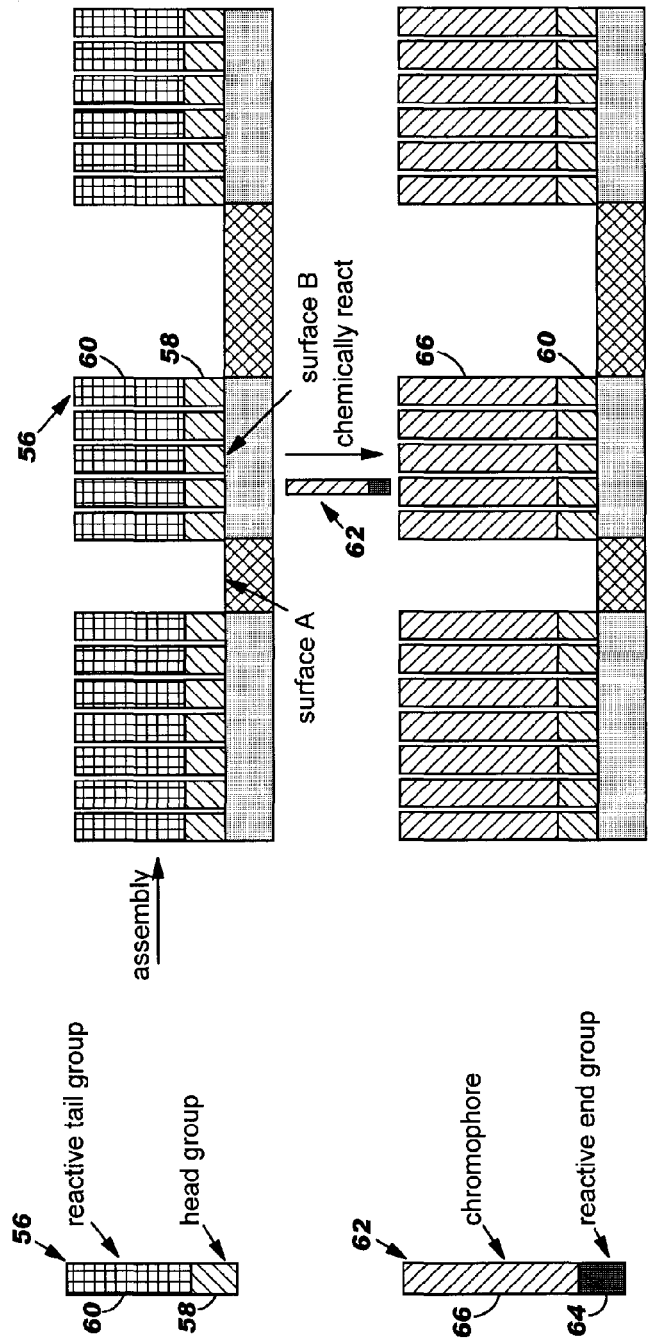

INSPECTION METHODS AND STRUCTURES FOR VISUALIZING AND/OR DETECTING SPECIFIC CHIP STRUCTURES

BACKGROUND OF THE INVENTION

1. Technical Field

The present invention is related to integrated circuits. More particularly, the present invention provides inspection methods and structures for visualizing and/or detecting specific chip structures.

2. Related Art

Many back-end-of-the-line (BEOL) semiconductor process layers and structures are optically transparent when planar. The optical transparency of such layers/structures makes undesired planar residual chip structures difficult to detect. For example, inadequate removal of a Cu BEOL TaN liner can result in low yields due to conductive shorts formed by the liner itself. An example of this problem is illustrated in FIG. 1. In this example, chemical-mechanical polishing (CMP) failed to completely remove the TaN liner 12 in the area 18 between Cu metal conductors 14 and 16. This can result in low yield due to shorts between the Cu metal conductors 14, 16 caused by the residual conductive TaN liner 12. It can be hard to detect such underpolishing of the TaN liner 12, since the TaN liner 12 is planar and therefore difficult to detect because of its optical transparency. A physical cross-section is often the only sure way to determine if such a structure is missing, not located where it should be, or present where it should not be. However, physical cross-sections are destructive, time and resource consuming, and must be provided off-line. Physical cross-sections also need to be directed to specific location(s) on the wafer or chip, unless the problem is very gross.

There is a need, therefore, for inspection methods and structures for visualizing and/or detecting specific chip structures.

SUMMARY OF THE INVENTION

The present invention provides inspection methods and structures for facilitating the visualization and/or detection (hereafter referred to collectively as "detection") of specific chip structures. In one embodiment, optical or fluorescent labeling techniques are used to "stain" a specific chip structure for easier detection of the structure. In another embodiment, a temporary/sacrificial illuminating (e.g., fluorescent) film is added to the semiconductor process to facilitate the detection of a specific chip structure. In another embodiment, a specific chip structure is doped with a fluorescent material during the semiconductor process. The present invention can be used, for example, in-line during chip fabrication and/or in a laboratory environment. In addition, the present invention could be implemented as non-destructive automated inspection, in conjunction with the fabrication process.

A first aspect of the present invention is directed to a method of forming a semiconductor structure, comprising: providing a first and a second material; processing the first material to form a portion of the semiconductor structure; and detecting a condition of the second material to determine whether processing of the first material is complete.

A second aspect of the present invention is directed to a semiconductor structure for detecting completion of processing of a material, comprising: a sacrificial layer formed below the material, the sacrificial layer having a detectable condition.

A third aspect of the present invention is directed to a method of forming a semiconductor device, comprising: providing a fluorescent material; and using a fluorescence of the fluorescent material to determine a presence of a predetermined material of the semiconductor device.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 10–11 depict the binding of molecules to specific surface chemistries, wherein the molecules include fluorescent chromophores.

DETAILED DESCRIPTION OF THE INVENTION

Figure 1:
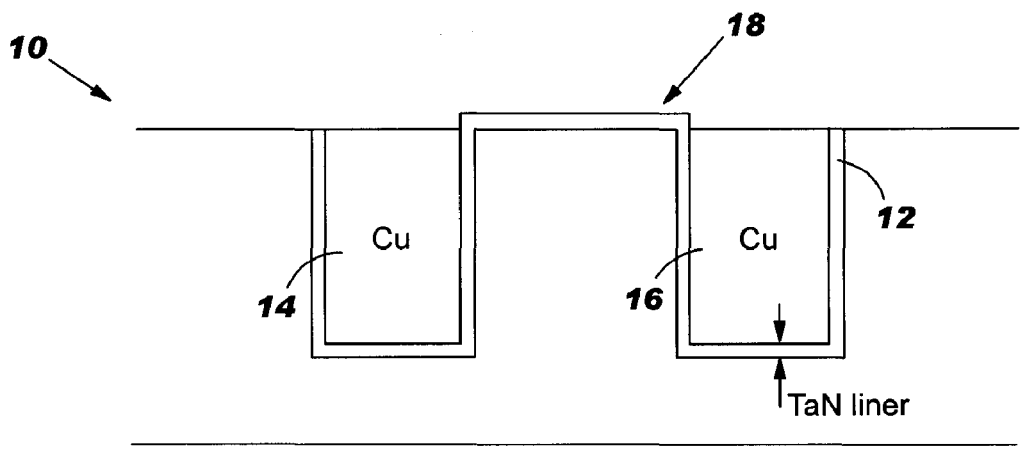
FIG. 1 illustrates an example of the inadequate removal of a liner, which results in shorting between two adjacent metal conductors.
Figure 2:
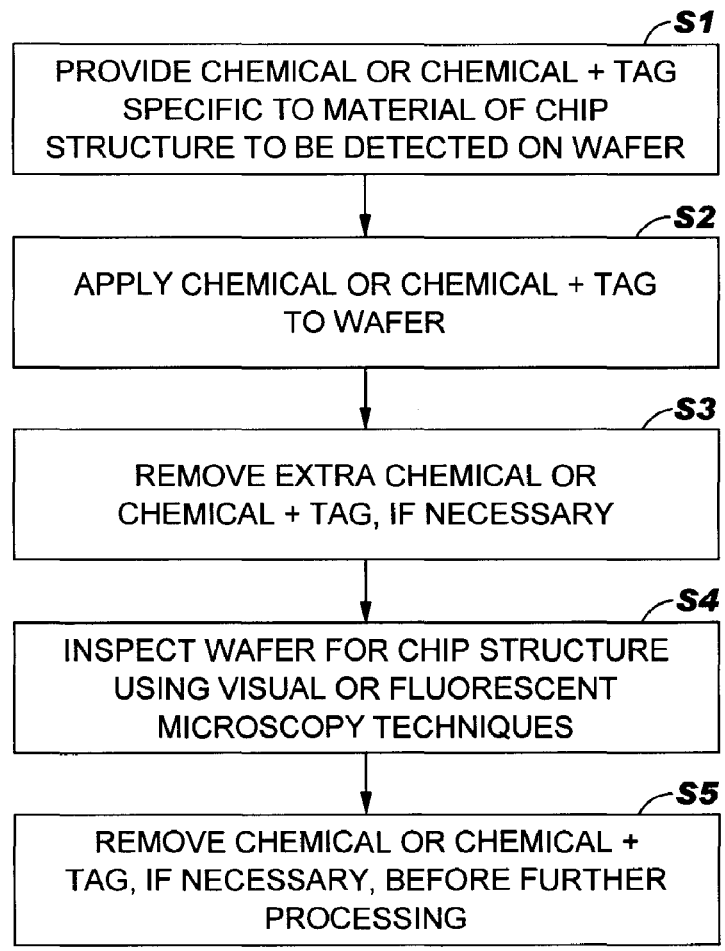
FIG. 2 depicts a flow diagram illustrating the general methodology of an embodiment of the present invention, wherein a chemical or chemical+tag has been applied to a wafer to detect a specific chip structure.

In one embodiment of the present invention, optical or fluorescent labeling techniques are used to "stain" a specific chip structure on a wafer for easier detection of the structure. As depicted in the flow diagram illustrated in FIG. 2, the general methodology of this embodiment comprises: (Step S1) Provide a chemical or chemical+tag that has an observable/detectable optical or fluorescent property specific for the material of the chip structure to be detected on a wafer. The chemical or chemical+tag can be observed/detected using, for example, optical or fluorescent microscopy; (Step S2) Apply the chemical or chemical+tag to the wafer; (Step S3) Remove extra chemical or chemical+tag, if necessary; (Step S4) Inspect the wafer for the chip structure using visual or fluorescent microscopy techniques. This can be done in-line or off-line (e.g., during failure analysis); and (Step S5) Remove the chemical or chemical+tag, if necessary, before further processing. As described below, the present invention can be implemented in conjunction with chemical-mechanical polishing.

An example of this embodiment of the present invention is described below with regard to the detection of Cu after a chemical-mechanical polish (CMP). However, it will be apparent to those skilled in the art that the invention may be modified to detect many other materials/structures during wafer fabrication by using chemicals or chemicals+tags specific to the materials/structures to be detected. Other such materials may include, for example, Ta, TaN, Ta oxide, Cu oxide, Ti nitride, etc. In addition, although the chemical or chemical+tag are applied to the wafer via a CMP slurry, it will be apparent that other application techniques may also be used without departing from the intended scope of the present invention.

CMP systematics due to process level topology are often time consuming to definitively identify. For example, polish over wide conductors may be suboptimal and result in a dip between the conductors. Minimum sized and pitched conductors on level n+1 over the wide conductors may remain shorted together after the n+1 polish step. These types of systematics are usually discovered at wafer final test, and require diagnostics/fault isolation and physical failure analysis to determine the root cause. In this embodiment of the present invention, however, a simple in-line method to detect, observe, and locate specific chip structures during wafer processing (e.g., at CMP process steps) is provided. This method may also be used off-line, for example, during failure analysis.

Figure 3:
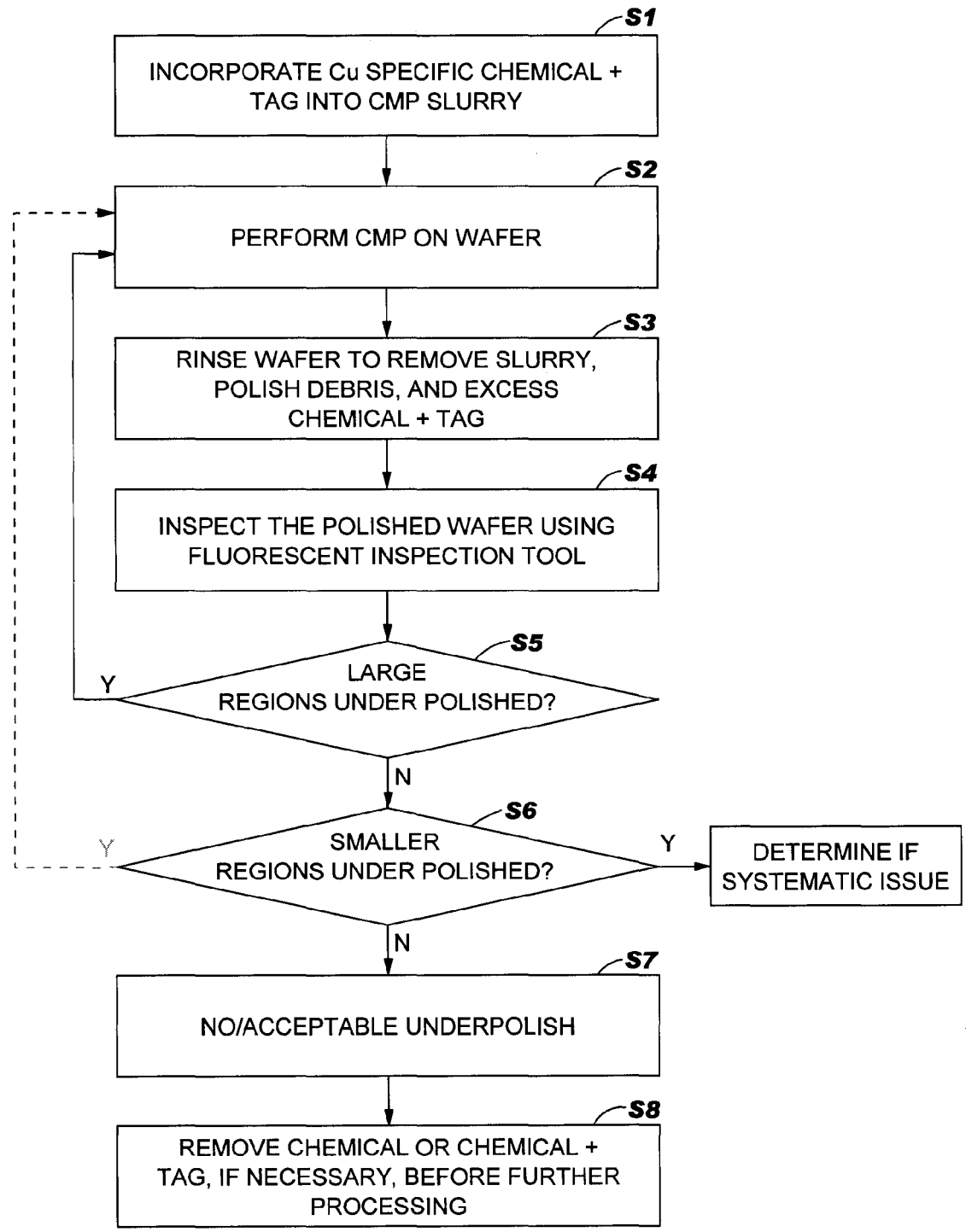
FIG. 3 depicts a flow diagram illustrating the methodology of an embodiment of the present invention, wherein a chemical+tag has been applied to a wafer via a CMP slurry to detect a specific chip structure.
Figure 4:
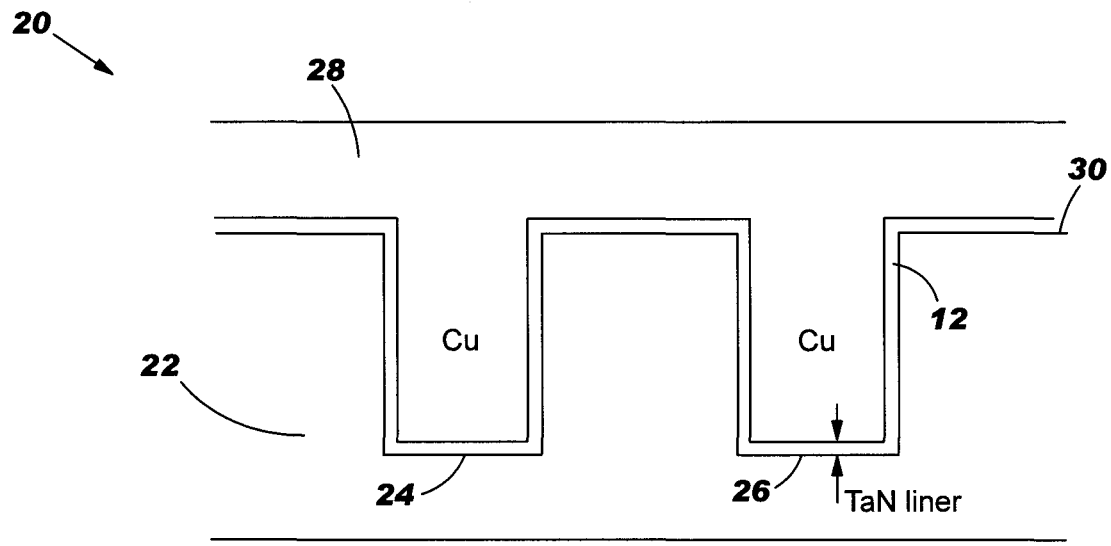
FIGS. 4–9 depict the embodiment of FIG. 3 in greater detail.

As depicted in the flow diagram illustrated in FIG. 3, the methodology of this embodiment for the illustrative example of Cu detection after chemical-mechanical polishing (CMP) comprises: (Step 1) Incorporate a Cu specific chemical+tag into the CMP slurry. The light emission of the tag must be matched with the light detection of the fluorescent inspection tool; (Step S2) Perform the CMP polish step; (Step S3) Rinse the wafer to remove slurry, polish debris, and excess chemical+tag; (Step S4) Inspect the polished wafer using fluorescent inspection tool. This can be done in-line or off-line (e.g., during failure analysis); (Step S5) If inspection finds that large regions have been under polished, return to Step S2 and continue the CMP process; (Step S6) If inspection finds smaller regions of underpolish, determine if there is a systematic issue. Alternately, or in addition, flow can return to Step S2 to continue the CMP process (this is shown in phantom in FIG. 3); (Step S7) If inspection detects no underpolish, or an acceptable amount of underpolish, continue to next step; and (Step S8) Remove remaining chemical+tag from wafer, if necessary, and continue processing.

Figure 5:
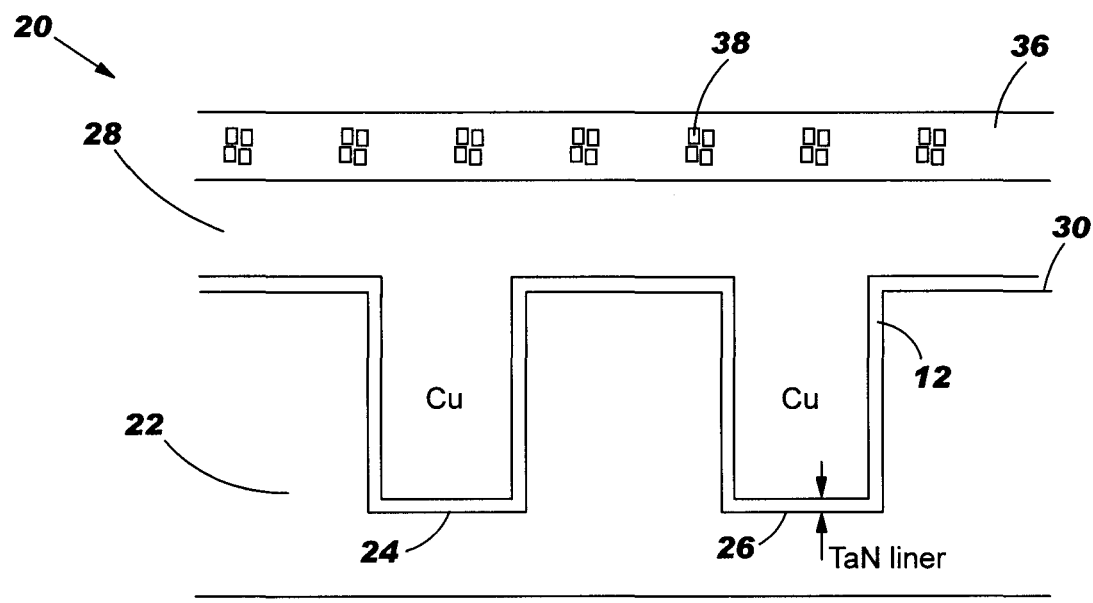
Figure 6:
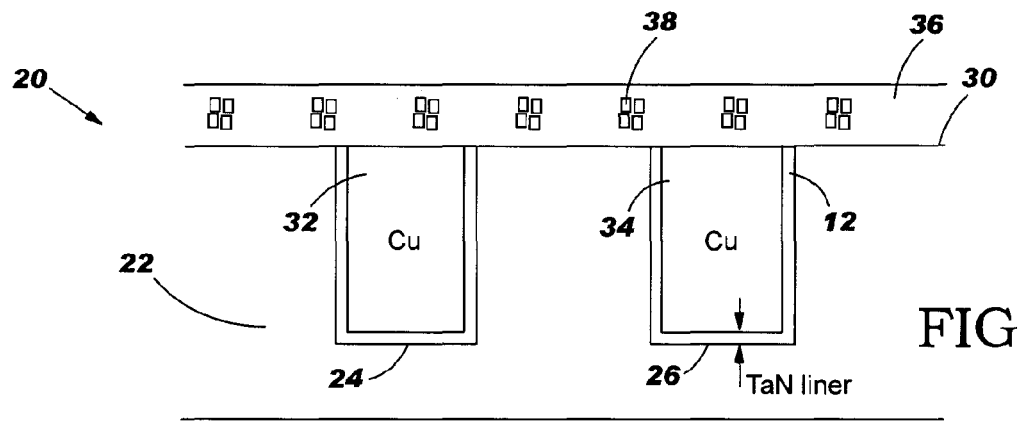

The methodology depicted in FIG. 3 is illustrated in greater detail in FIGS. 4–8. The device 20 shown in FIG. 4 includes a TaN liner 12 that has been formed over an oxide layer 22 and openings 24 and 26. A layer 28 of Cu has been formed over the TaN liner 12 and fills the openings 24 and 26. During subsequent CMP processing, the Cu layer 28 is removed down to the surface 30 of the oxide 22 to form Cu conductors 32 and 34 (FIG. 6).

Figure 7:
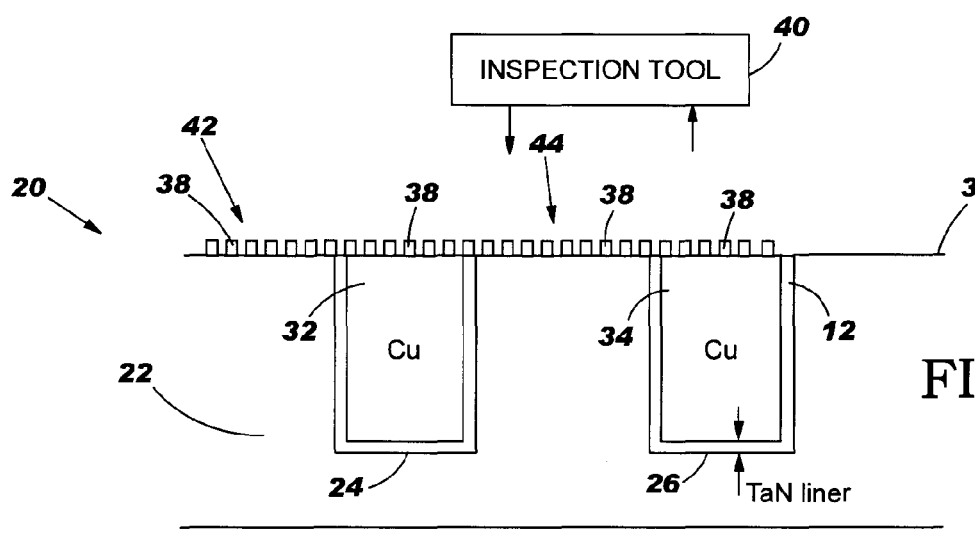

As shown in FIG. 5, prior to CMP processing, a CMP slurry 36 is deposited on the surface of the Cu layer 28. In accordance with the present invention, a chemical+tag 38 (fluorescent) specific to Cu is incorporated into the CMP slurry 36. CMP processing is performed to remove the Cu layer 28 and TaN liner 12 down to the surface 30 of the oxide 22. This is illustrated in FIG. 6. During CMP processing, the tags 38 attach to any remaining exposed areas of the Cu layer 28. In FIG. 7, the slurry, polish debris, and excess chemical+tag are removed.

Figure 8:
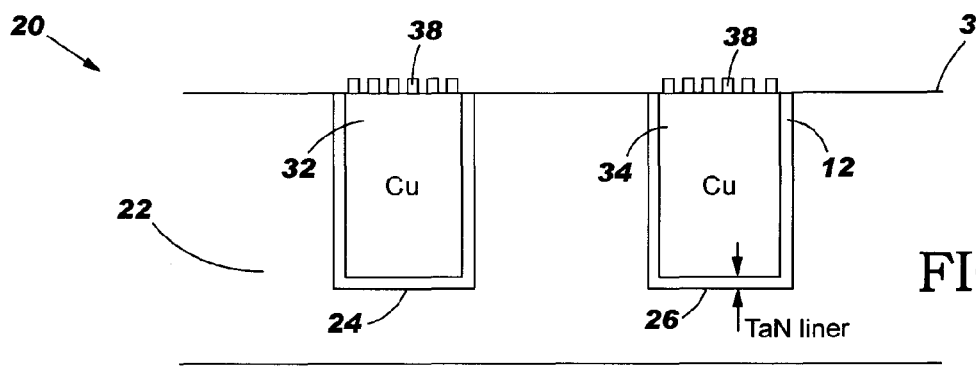

Upon inspection by a fluorescent inspection tool 40, it is found that the surfaces of the Cu conductors 32 and 34 fluoresce, as expected (i.e., the fluorescent tags 38 specific to Cu have attached themselves to the exposed surfaces of the Cu conductors 32, 34 and fluoresce during inspection). In addition, the areas 42 and 44 on the surface 30 of the oxide 22 fluoresce, indicating that the Cu layer 28 was not completely removed down to the oxide 22 in those areas (i.e., the fluorescent tags 38 specific to Cu have attached themselves to the residual areas 42 and 44 of Cu on the surface 30 of the oxide 22 and fluoresce during inspection). Accordingly, CMP processing is repeated and additional polishing is performed. Thereafter, the surface 30 of the device 20 is cleaned and inspected again for areas of excessive fluorescence, and the CMP processing is repeated again, if necessary. These steps are repeated until inspection reveals that an acceptable amount of fluorescence is visible on the surface of the device, as shown in FIG. 8. In this case, the fluorescent tags 38 specific to Cu are only attached to the exposed surfaces of the Cu conductors 32, 34, and not to other areas on the surface 30 of the oxide 22. Any now known or later developed fluorescent inspection tool capable of inspecting semiconductor devices can be used in the practice of the present invention.

Figure 9:
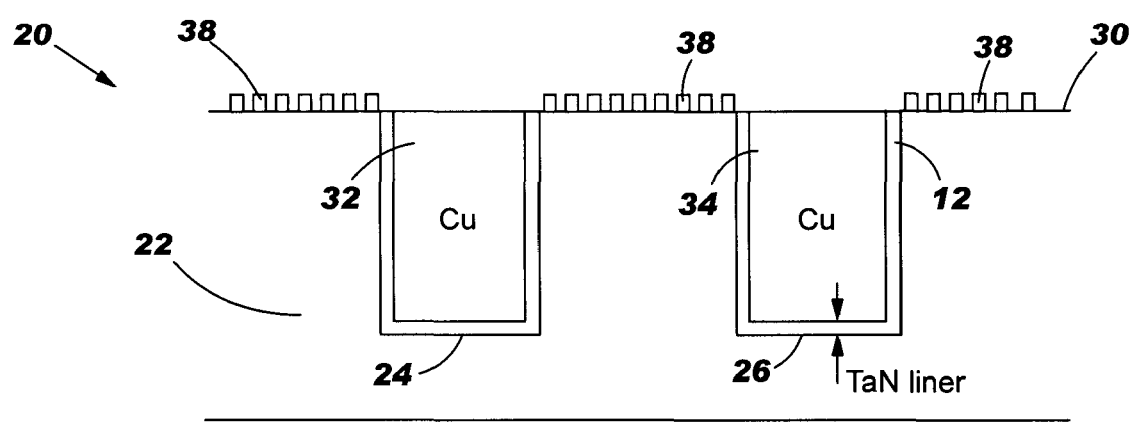

It should be noted that a "negative" image of the device 20 may be provided by using a tag 38 that is specific to the oxide layer 22 instead of the Cu layer 28. In this case, after complete removal of the residual Cu layer 28, the surfaces of the Cu conductors 32 and 34 do not fluoresce, while the surface 30 of the oxide layer 22 does fluoresce. This is shown in FIG. 9.

A tag specific to the TaN liner 12 (or other exposed materials) may also be used. In this case, only the exposed portions of the TaN liner 12 (or other exposed materials) on the surface 30 will fluoresce. The amount and location of the fluorescence provides an indication of the completeness of the CMP. Of course, if a tagged material to be detected is intended to be completely removed during CMP, the lack of any fluorescence indicates the complete removal of that material.

Synthetic chemical routes have been developed that enable molecules to be designed and prepared with a wide range of chemical and physical properties. Chemical functionalization has been used to prepare molecules with head groups that enable binding to and self-assembly of molecules on surfaces. Molecules may be synthesized and then allowed to self-assemble from common solvents onto surfaces. The chemical nature of the head group provides specificity for the selective assembly of molecules on particular surfaces. In addition, molecules with reactive tail groups may be further functionalized with additional moieties once assembled on the surface to provide a chemically tagged surface with the desired physical properties.

As shown in FIG. 10, for inline inspection using fluorescence detection, a molecule 50 may be synthesized with a head group 52 that binds to a particular surface and a tail group 54 that contains a chromophore, which may be chosen to absorb and fluoresce at desired wavelengths. Combinations of head groups and chromophores may be chosen to bind to desired surfaces and to absorb and emit at desired wavelengths to chemically tag surfaces with molecules for fluorescence detection. The molecules 50 may be self-assembled from solution and bind onto specific surface chemistries. In FIG. 10, for example, the molecules bind onto surface B, but do not bind to surface A. Alternatively, as shown in FIG. 11, a surface (surface B) may be selectively tagged with a molecule 56 that has a head group 58 that binds to the surface and a reactive tail group 60 that is used for further chemical reaction. The molecules 56 on the surface may then be further reacted with an additional molecule 62 comprising a reactive head (end) group 64 and chromophore 66.

Head groups may be chosen to bind to particular surfaces. For example, head groups such as silanes, phosphonic acids, and hydroxamic acids have been shown to bind to $SiO_2$ surfaces. Head groups such as thiols, isocyanides, acetylenes have been shown to bind to Cu surfaces. Exploration of different chemistries continues to increase the understanding of the different chemical functionalities that selectively bind to particular surfaces.

Conjugated molecules act as good chromophores and are commonly used in areas such as biological tagging, laser dyes, and organic light emitting diodes. Examples of these include chromophores such as oligothiophenes, oligophenylenes, oligophenylenevinylenes, coumarins, and fluorescing. The absorption and emission wavelengths of many of these molecules, such as oligothiophenes, oligophenylenes, and oligophenylenevinylenes, are tuned by the number of rings in the molecules. The absorption and emission of coumarins are tailored by additional functionalization off the coumarin moiety.

Specific examples for chemical tagging of Cu would therefore include terthiophene ethyl isocyanide, terthiophene ethyl thiol, tetrathiophene ethyl thiol, and terphenylacetylene. Specific examples for chemical tagging of $SiO_2$ would therefore include terthiophene ethyl phosphonic acid, tetrathiophene ethyl phosphonic acid, terthiophene ethyl hydroxamic acid, and terphenyltrichlorosilane.

Alternatively, examples such as vinyl-terminated alkyltrichlorosilanes have been assembled onto the surface of $SiO_2$, where the silane acts as the head group that binds to the $SiO_2$ surface and the vinyl group provides a reactive end functionality for further chemistry. The vinyl group may be oxidized to provide a carboxylic acid end group and then reacted with a chromophore having an alcohol group to attach the chromophore to the surface bound species. Chromophores such as pyrene and phthalocyanines have been demonstrated.

The chemical tag may be used as a fluorescent tag to selectively label a specific surface. The chemical tag may be applied to the surface by immersing the substrate in solution or by incorporating it in the slurry used to polish the surface. The surface should be well washed afterwards to ensure that only molecules bound to the substrate surface remain for inspection and indication of the presence of particular surfaces such as unremoved metal and specific chip structures.

A chemical tag that binds selectively to an oxide (e.g., $SiO_2$) surface will appear bright where there is oxide and will be dark where there is metal, as no chromophore will be bound to any remaining metal. A chemical tag that binds selectively to a metal surface will show fluorescence where there is metal and not, for example, oxide, although the emission contrast between the surfaces may not be large. A chemical tag that binds selectively to a TaN liner will show fluorescence where the TaN liner exists. As detailed above, such selective fluorescence can be used to determine the presence of specific chip structures (e.g., Cu, oxide, residual TaN liner) on a wafer.

Figure 12:
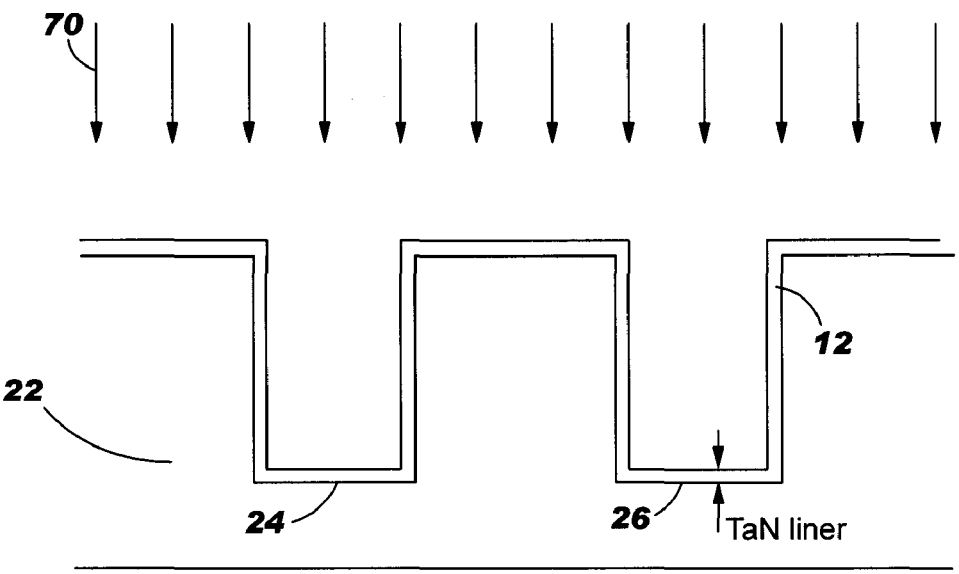
FIGS. 12–13 depict another embodiment of the present invention, wherein a material of a semiconductor device is doped with a fluorescent material.
Figure 13:
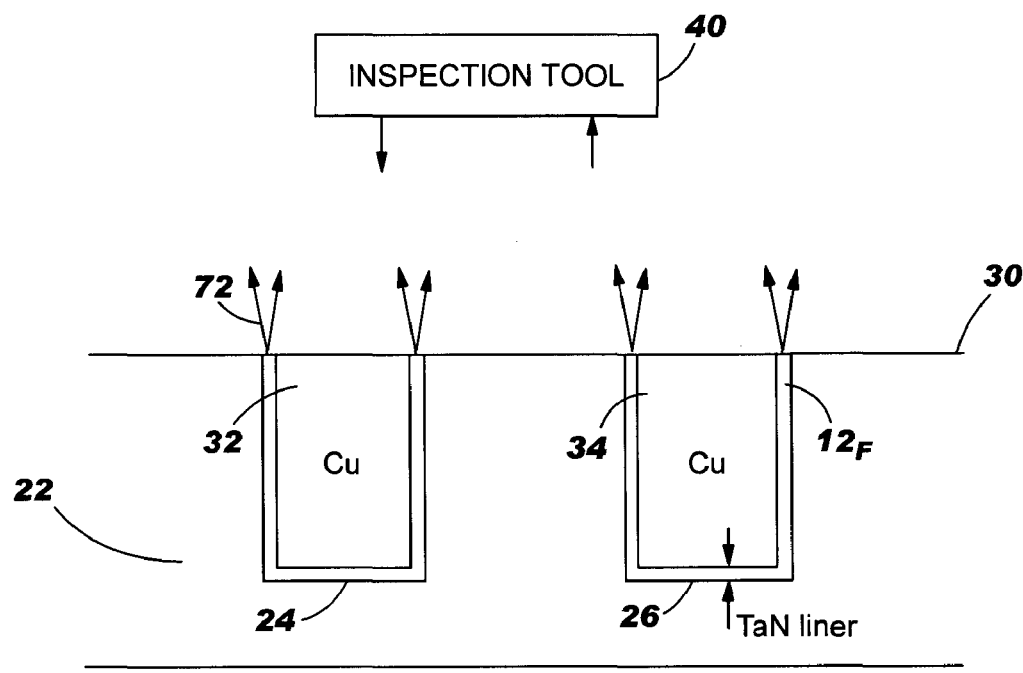

In another embodiment of the present invention, a layer of material (e.g., a TaN liner, oxide, etc.) is doped with a fluorescent material during/after formation of the layer. For example, as shown in FIG. 12, a TaN liner 12 is formed over an oxide layer 22 and openings 24 and 26. During/after formation of the TaN liner 12, the TaN liner 12 is doped with a fluorescent material 70, forming a fluorescent TaN liner $12_F$. Thereafter, a layer of Cu is formed over the fluorescent TaN liner $12_F$ and planarized to the surface 30 of the oxide layer 22 to form Cu conductors 32, 34. After CMP processing, a fluorescent inspection tool 40 may be used to examine the surface of the device for residual TaN liner $12_F$, which will fluoresce as indicated by arrows 72 in FIG. 13, and CMP processing is repeated, if necessary. The fluorescent material may comprise, for example, Europium (half a percent or less), which is highly fluorescent. Other fluorescent materials such as Lanthanum, Samarium, Gadolinium, Ytterbium, Terbium, Dysprosium, and Thulium may also be used. It will be apparent to one skilled in the art that many other now known or later developed fluorescent materials can be used in the practice of the present invention.

The above doping process can also be applied to materials/layers of the device other than the TaN liner 12. For example, referring again to FIG. 12, during/after the formation of the oxide layer 22, the oxide layer 22 can be doped with a fluorescent material (e.g., Europium, etc.) to provide a fluorescent oxide layer 22. Thereafter, the TaN liner 12 is formed over the fluorescent oxide layer 22, and the layer of Cu is formed over the TaN liner 12. The layer of Cu is then planarized to the surface 30 of the fluorescent oxide layer 22 to form Cu conductors 32, 34. After CMP processing, the fluorescent inspection tool 40 may be used to examine the surface 30 of the fluorescent oxide layer 22 to determine the completeness of the CMP processing.

Figure 14:
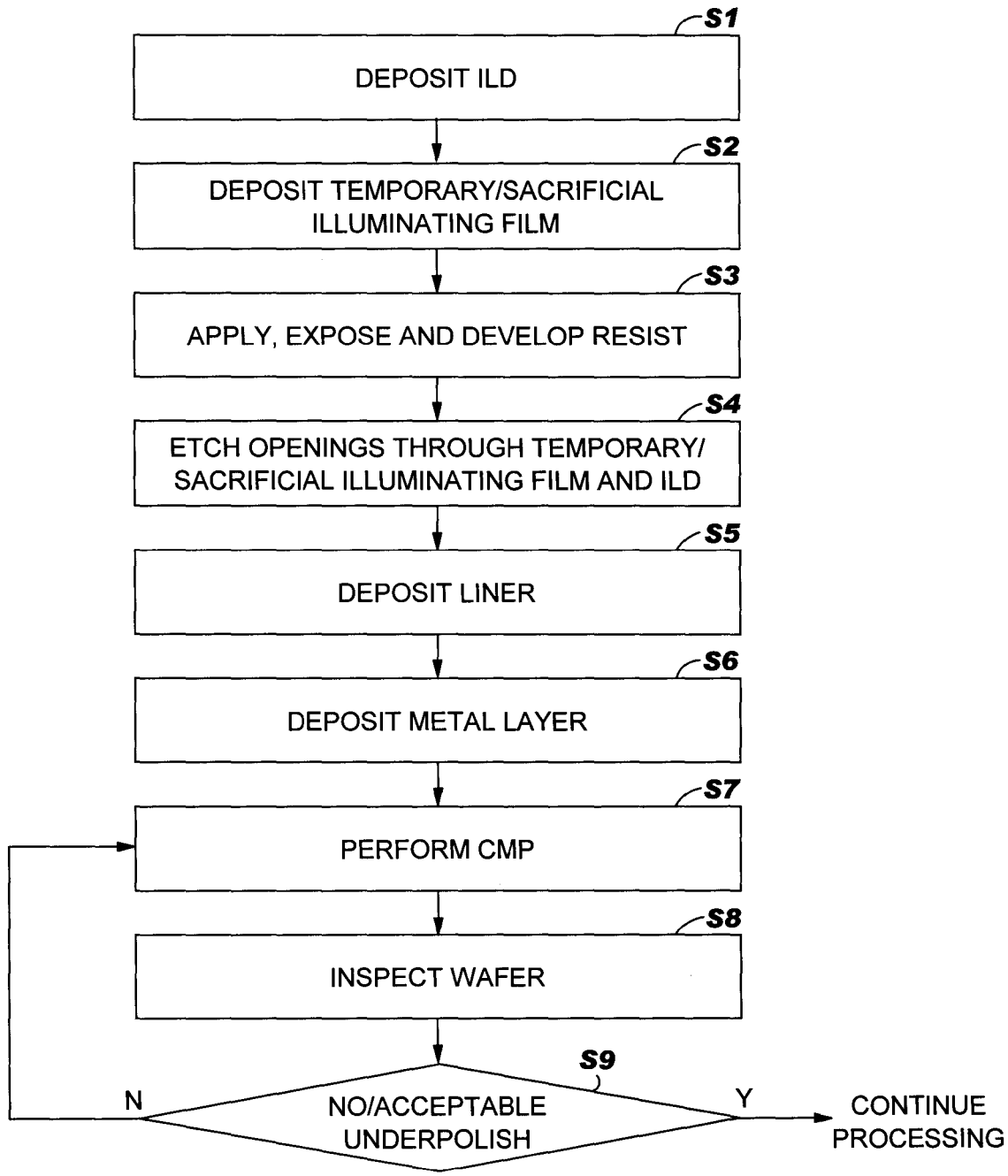
FIG. 14 depicts a flow diagram illustrating the methodology of another
embodiment of the present invention, wherein a temporary/sacrificial
illuminating film is added to the semiconductor process to identify a specific chip structure.

In another embodiment of the present invention, a temporary/sacrificial illuminating film is added to the semiconductor process to identify specific chip structures (e.g., planar residuals due to underprocessing). The methodology of this embodiment is illustrated in FIG. 14. An example of this embodiment is illustrated in FIGS. 15–18.

As depicted in the flow diagram illustrated in FIG. 14, the methodology of this embodiment of the present invention, when directed to the detection of a residual TaN liner, comprises: (Step S1) Deposit inter-level dielectric (ILD) over a previous layer; (Step S2) Deposit temporary/sacrificial illuminating film over ILD. (Step S3) Apply, expose, and develop resist (e.g., to form areas where conductors(s) will be subsequently formed); (Step S4) Etch openings through temporary/sacrificial illuminating film and IDL; (Step S5) Deposit liner (e.g., TaN liner) over remaining temporary/sacrificial illuminating film and openings; (Step S6) Deposit metal layer (e.g., Cu) over liner; (Step S7) Perform CMP through metal layer, liner, and temporary/sacrificial illuminating layer; (Step S8) Inspect polished wafer using fluorescent inspection tool. This can be done in-line or off-line (e.g., during failure analysis); (Step S9) If inspection detects no underpolish, or an acceptable amount of underpolish, continue to next step of wafer processing. If inspection finds unacceptably large regions have been under polished, return to Step S8 and continue CMP process.

Figure 15:
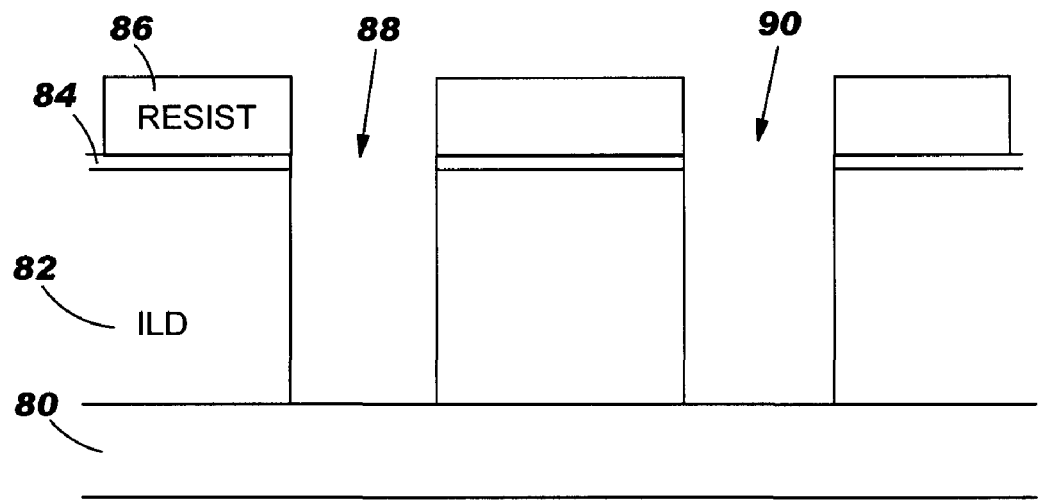
FIGS. 15–18 depict the embodiment of FIG. 14 in greater detail.

An application of the above-described methodology is illustrated in FIGS. 15–18. In FIG. 15, an inter-level dielectric (ILD) 82 has been formed over a layer 80 of material, and a temporary/sacrificial illuminating film 84 has been formed over the ILD 82. In addition, a layer of resist 86 has been applied, exposed, and developed, and etching has been performed to form openings 88, 90 through the temporary/sacrificial illuminating film 84 and the IDL 82 to the layer 80.

Figure 16:
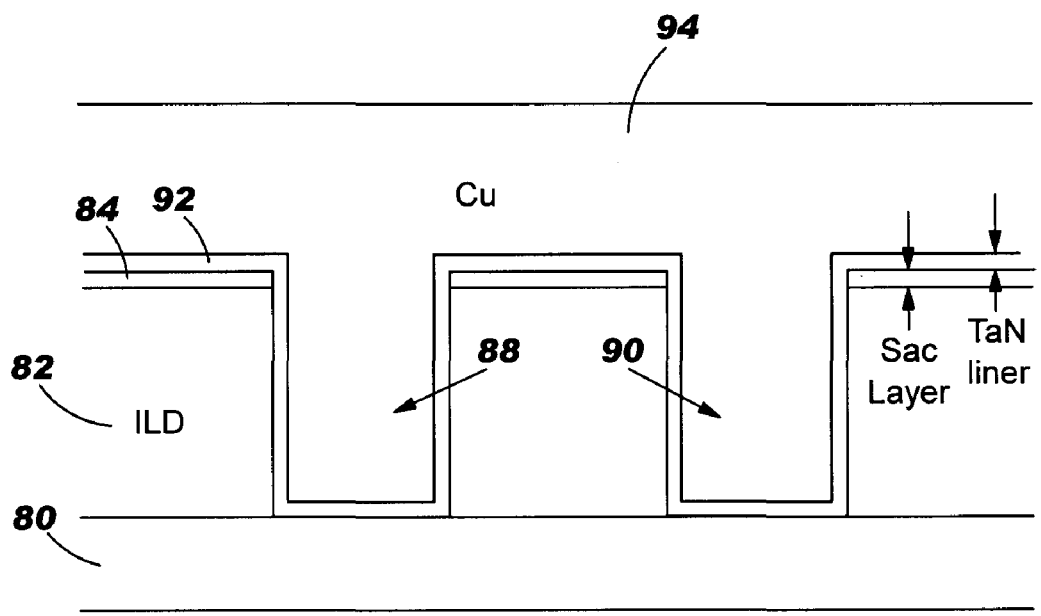
Figure 17:
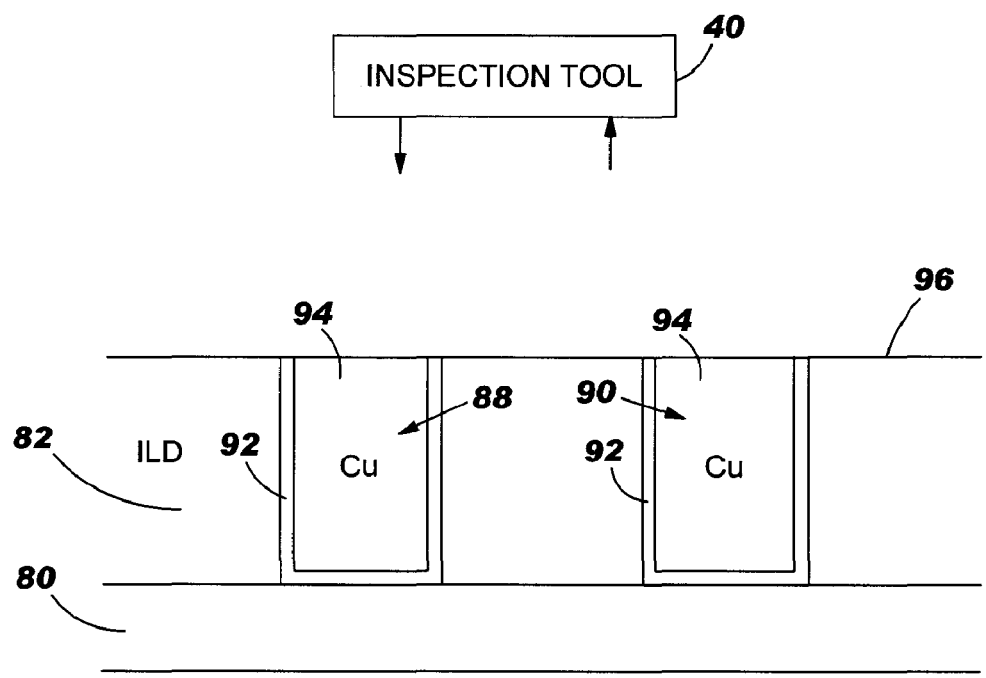
Figure 18:
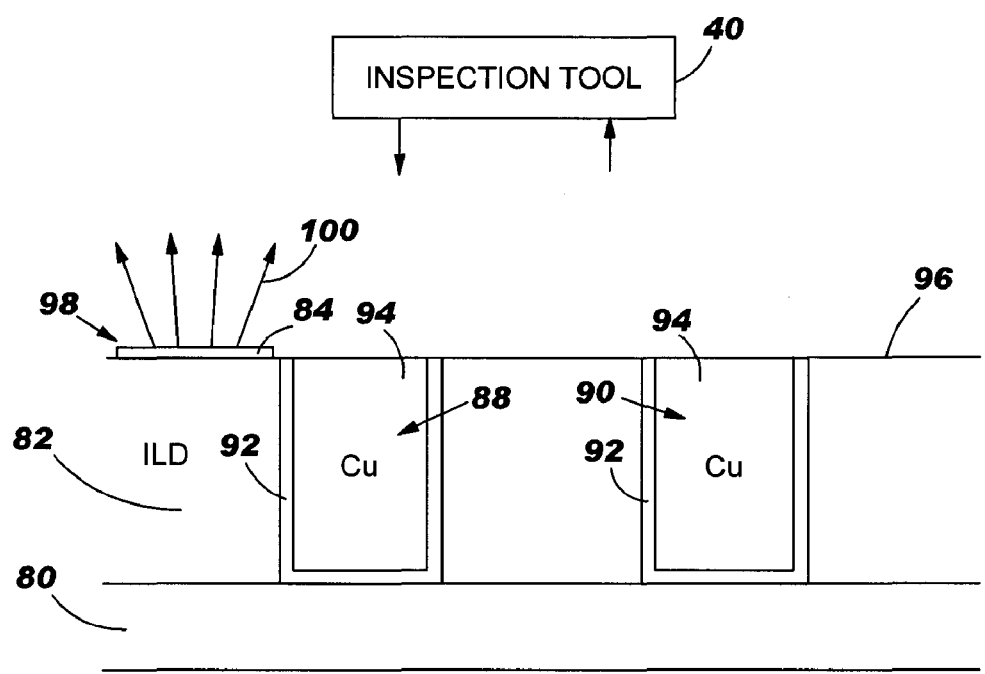

In FIG. 16, after resist removal, a TaN liner 92 is formed over the temporary/sacrificial illuminating film 84 on the ILD 82 and in the openings 88, 90, and Cu metal layer 94 is deposited over the TaN liner 92. The Cu metal layer 94 and TaN liner 92 are then removed using CMP processing down to the surface 96 of the ILD 82, as shown in FIG. 17. After completion of the CMP process, the polished wafer is inspected by a fluorescent inspection tool 40, and CMP processing is repeated, if necessary. Additional CMP processing may be required, for example, if fluorescence due to the presence of residual temporary/sacrificial illuminating film 84 is detected on the surface 96 of the ILD 82. This is shown in FIG. 18, wherein an area 98 of residual temporary/sacrificial illuminating film 84 remains on the surface 96 of the ILD 82 after CMP processing and fluoresces as indicated by arrows 100 when inspected by a fluorescent inspection tool 40. In this embodiment, the disappearance of the temporary/sacrificial illuminating film 84 after CMP processing is a signal that the TaN liner 90 has been completely removed from the surface 96 of the ILD 82.

The temporary/sacrificial illuminating film 84 can comprise, for example, a europium chelate europium thenoyltrifluoroacetonate (EuTTA) material. Many rare earth chelates have the property of fluorescing in response to UV or near-UV radiation, including La, Sm, Eu, Gd, Lu, Yb, Tb, Dy, and Tm. Other (beta)-diketone chelates such as Eu benzoylacetonate, Eu dibenzoylmethide, and Eu hexafluoroacetonate are available and could be used. Other suitable fluorescing films now known or later developed may also be used. For example, the temporary/sacrificial illuminating film 84 can be provided by doping a suitable material with an organic chromophore having fluorescent characteristics.

The application of a EuTTA film can be accomplished by mixing the EuTTA with a solvent solution of Poly(methyl methacrylate), (PMMA). The solution is applied to the wafer in a spin coater and dried. One typical composition of the film would be 1.2 weight percent EuTTA, 1.8 weight percent PMMA, and 97 weight percent methylethyl ketone (MEK). The composition of the film can be modified to yield different film thicknesses. The solvent system can be varied to meet process compatibility constraints.

PMMA has been used as a lithographic resist for e-beam exposure, and thus has properties compatible with processing. During ILD opening/trench etch, PMMA is etched by the same general processes used to etch photoresist or organic dielectrics.

Spin on glass (SOG) can also be used as the temporary/sacrificial illuminating film. For example, a compound called dEuFOD (perdeutero-(tris-6,6,7,7,8,8,8-heptafluor-2,2-dimethyl-3,5-octandionato) europium) can be used for temperatures up to 200 C.

SOG is used in the industry as an ILD, and thus is compatible with current ILDs. SOG is etched by the same general processes as hardmasks and/or certain inter-level dielectrics, and is compatible with and can be integrated into current processes. SOG, as a glass, is compatible with current resist strip processes.

Various thickness films (e.g., on the order of 300 nm thick) can be used in the practice of the present invention. The thickness required is driven primarily by the optical properties of the illuminator. The film thickness could be further reduced if optical image enhancement (e.g., image intensifier or image processing) means were used in detecting the fluorescence. This enhancement would also compensate for very thin films left as process residuals. Calculations show that a film as thin as 500 angstroms could be used. The dielectric constant of the film is not of concern as a properly processed wafer will have all film removed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A semiconductor structure for detecting completion of processing of a material, comprising: a sacrificial layer formed below the material, the sacrificial layer having a detectable condition, wherein the material comprises a liner for interconnects in a wiring level.

2. The semiconductor structure of claim 1, wherein the sacrificial layer comprises a fluorescent film, and wherein the detectable condition comprises fluorescence.

3. A semiconductor structure for detecting completion of processing of a material, comprising:
a sacrificial layer formed below the material, the sacrificial layer having a detectable condition,
wherein the sacrificial layer is selected from the group consisting of: europium thenoyltrifluoroacetonate (EuTTA); chelates of La, Sm, Eu, Gd, Lu, Yb, Tb, Dy or Tm; and (beta)-diketone chelates including Eu benzoylacetonate, Eu dibenzoylmethide or Eu hexafluoroacetonate.

* * * * *